United States Patent [19]

Salie

[11] Patent Number: 4,484,039
[45] Date of Patent: Nov. 20, 1984

[54] MEMBRANE SWITCH HAVING IMPROVED SWITCH TAIL

[75] Inventor: Edward R. Salie, Malden, Mass.

[73] Assignee: AMP Incorporated, Harrisburg, Pa.

[21] Appl. No.: 527,595

[22] Filed: Aug. 29, 1983

[51] Int. Cl.³ .............................................. H01H 9/26
[52] U.S. Cl. .................................. 200/5 A; 200/159 B; 200/292
[58] Field of Search .................. 200/5 A, 159 B, 292, 200/333; 361/398; 339/17 F, 176 MF

[56] References Cited

U.S. PATENT DOCUMENTS

| | | | |
|---|---|---|---|
| 3,065,444 | 11/1962 | Crimmins | 339/176 MF |
| 4,317,011 | 2/1982 | Mazurk | 200/159 B X |
| 4,356,358 | 10/1982 | Fukukura | 200/159 B X |

Primary Examiner—A. D. Pellinen
Assistant Examiner—Susan Steward
Attorney, Agent, or Firm—F. W. Raring

[57] ABSTRACT

Membrane switch assembly comprises a substrate, a membrane, and a separator between the opposed surfaces of the substrate and membrane. Opposed switch electrodes are provided on the opposed surfaces and circuit conductors are provided which extend between and among the electrodes. The assembly has a composite tail made up of a substrate tail section and a membrane tail section. The two tail sections are co-extensive and parallel. Substrate leads extend from the substrate onto the substrate tail section and membrane leads extend from the membrane onto the membrane tail section, the leads being parallel and offset from each other. Portions of the substrate tail section extend through slots in the membrane tail section and portions of the membrane tail section extend through slots in the substrate tail section.

8 Claims, 6 Drawing Figures

MEMBRANE SWITCH HAVING IMPROVED SWITCH TAIL

FIELD OF THE INVENTION

This invention relates to membrane switches and particularly to improved tails for membrane switches onto which the circuit conductors of the switch extend. The leads on the tail of a membrane switch are connected to external conductors by a suitable electrical connecting means.

BACKGROUND OF THE INVENTION

A common type of membrane switch assembly comprises a substrate, a flexible membrane, and a separator positioned between the membrane and the substrate. Switch electrodes are provided on the opposed surfaces of the membrane and the substrate and circuit conductors extend between and among the electrodes on at least one of the surfaces. A tail extends from the assembly and the lead portions of selected circuit conductors extend onto the tail. The lead portions on the tail are, in turn, connected to external conductors. It is common practice to provide the tail as an extension of the membrane or, if the substrate is also of flexible material, as an extension of the substrate.

The circuit designer frequently encounters problems in the design of membrane switches of the type described above in that he encounters difficulty in laying out the circuit conductors such that lead portions can be provided on the tail. If circuit conductors are provided on both the membrane surface and the substrate surface, he must then extend circuit conductors across the fold line (if the switch assembly is a folded sheet of film) to the member having the tail extending therefrom. Quite often, the circuit designer will provide all of the circuit conductors on the membrane and have only commoning conductors on the substrate in order to avoid the necessity of having long circuit conductors extending across the fold line. This expedient, however, is often impractical because of the complexity of the circuit and it is necessary to provide circuit conductors on both the membrane and the substrate.

The present invention is directed to the achievement of an improved membrane switch assembly which will greatly simplify the task of the circuit designer in laying out the circuit conductors and providing lead portions on the tail of the switch assembly. The invention is thus directed to the achievement of an improved membrane switch assembly which permits a reduction in the complexity of the circuit and economies in the manufacture of the switch assembly.

A membrane switch assembly in accordance with the invention comprises a substrate, a membrane which is of a flexible insulating material, and a spacer layer between the membrane and the substrate. The substrate and the membrane have opposed first and second surfaces respectively, the opposed surfaces having opposed switch electrodes thereon at switch sites. The spacer has openings therein at the switch sites. Circuit conductors extend between and among the switch sites, and a tail extends from the assembly. The circuit conductors have leads which extend into the tail. The membrane switch assembly is characterized in that the substrate is also of a flexible insulating material and the tail comprises a substrate tail section, which extends from the substrate, and a membrane tail section which extends from the membrane. The tail sections are in parallel planes, are substantially co-extensive, and have opposed first and second tail surfaces which are contiguous with the opposed first and second surfaces of the substrate and the membrane respectively. The substrate and the membrane each have circuit conductors thereon, the circuit conductors on the substrate having substrate leads which extend onto the first tail surface and the circuit conductors on the membrane having membrane leads which extend onto the second tail surface. The substrate leads extend parallel to the membrane leads and are offset with respect to the membrane leads.

The substrate tail section and the membrane tail section each has a free end and side edges extending to the free end. Each tail section further has an end portion which extends to the free end from a location adjacent to its free end. The substrate leads and the membrane leads extend to the free end of the substrate tail section and the membrane tail section respectively and have contact portions extending across the end portions of the substrate tail section and the membrane tail section, the contact portions being exposed with the contact portions of the substrate leads facing oppositely with respect to the contact portions of the membrane leads.

The membrane tail section and the substrate tail section each have at least one slot extending transversely of the side edges of the tail sections, the slots being spaced from the free ends of the tail sections. A part of the end portion of the substrate tail section extends through the slot in the membrane tail section and a part of the end portion of the membrane tail section extends through the slot in the substrate tail section, the parts of the end portions which extend through the slots having the contact portions of conductors thereon.

A further embodiment is characterized in that the substrate leads are grouped on one side of a medial axis which extends from the free end of the tail between, and is parallel to, the side edges of the tail. The membrane leads are on the other side of the medial axis. The slot in the substrate tail section is on the other side of the medial axis and the slot in the membrane tail section is on the one side of the medial axis. An alternative embodiment is characterized in that the substrate leads are on both sides of the medial axis and the membrane leads are also on both sides of the medial axis, the slots in the substrate tail section and in the membrane tail section being in alignment with the membrane leads and the substrate leads respectively. The substrate tail section and the membrane tail section each have slits extending from their free ends inwardly through the end portions thereof, the slits forming flaps which are inserted through the slots.

Figure 2:
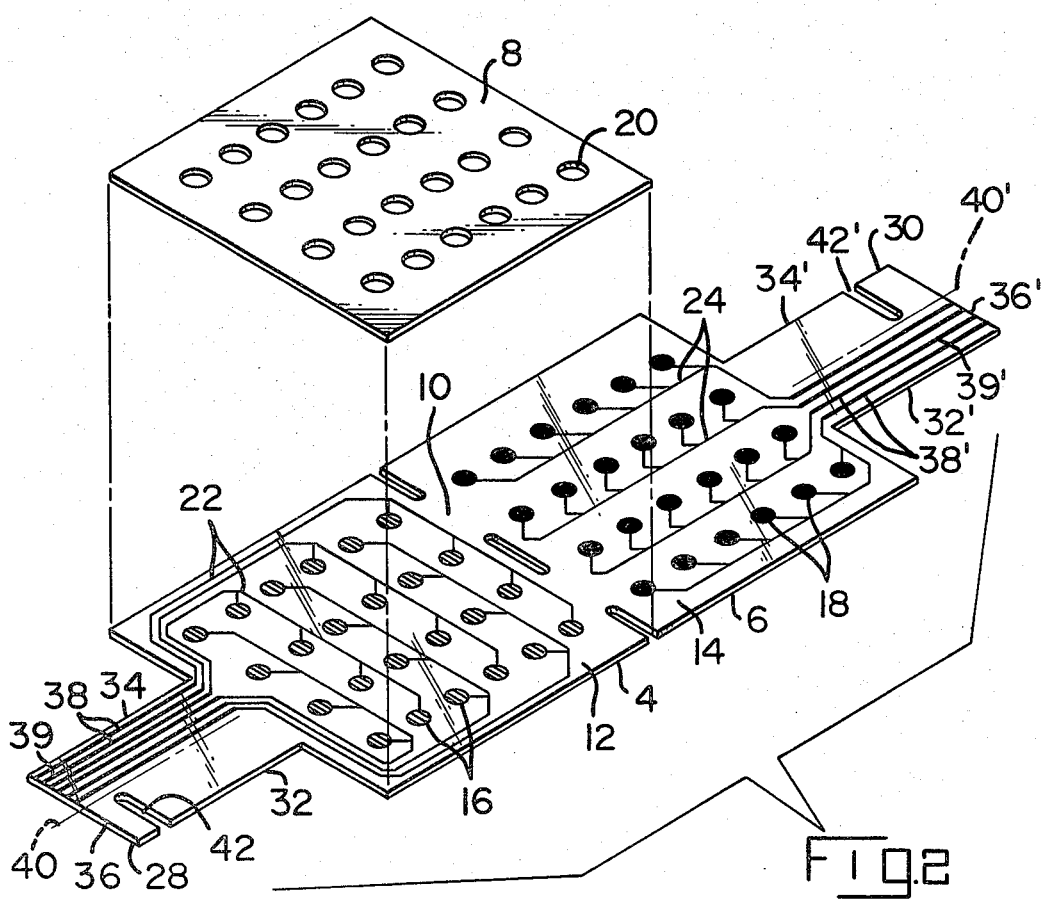
FIG. 2 is a view of the switch assembly of FIG. 1 with the one-piece substrate and membrane in the unfolded condition and with the separator exploded from the surface of the substrate.
Figure 3:
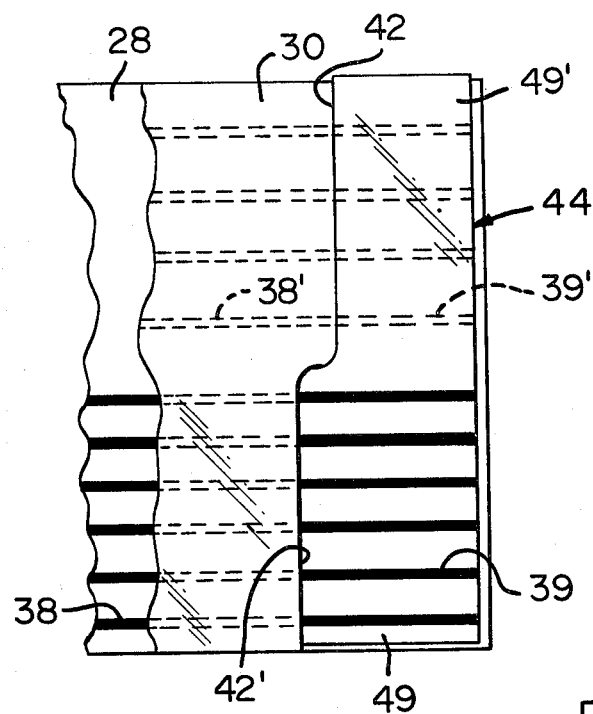
FIG. 3 is a plan view of the end of the composite tail of the switch assembly of FIG. 1.

A membrane switch assembly, FIG. 2, in accordance with the invention comprises a substrate 4, a membrane 6, and a separator 8 which is between the opposed surfaces 12, 14 of the substrate and membrane respectively. The substrate and membrane are both of flexible film material such as polyester film and are connected by integral hinges 10. The surface 12 has switch sites 16 thereon which are in alignment with and opposed to switch sites 18 on the surface 14 of the membrane 6. The spacer 8 comprises a sheet of film having openings 20 therein at the switch sites so that the external surface of the membrane 6 can be pressed at a particular switch site to engage the associated electrode 18 with the opposed electrode 16. The surface 12 of the substrate has circuit conductors 22 thereon and the surface 14 of the membrane has circuit conductors 24. These conductors extend between and among the switch sites and onto integral tail sections as described below.

The switch assembly 2 has a composite tail 26 made up of a substrate tail section 28 and a membrane tail section 30 which tail sections extend from the substrate and membrane respectively and which are located such that upon folding, the tail sections will be in alignment with and parallel to each other. The substrate tail section 28 has side edges 32, 34, and a free outer end 36. The membrane tail section has side edges and a free end as indicated at 32', 34', and 36'.

Substrate leads 38 extend from selected substrate circuit conductors 22 onto the substrate tail section 28, the end portions 39 of these leads serving as contact portions as will be described below. Membrane leads 38' similarly extend to the free end 36' of the membrane tail section and have contact portions 39'.

In the embodiment of FIG. 2, all of the substrate leads 38 are located on one side of a medial axis indicated at 40 which extends between, and is parallel to, the side edges 32, 34 of the substrate tail section 28. The membrane leads 38' are located on the other side of the axis as indicated at 40' in FIG. 2 so that when the membrane is folded against the substrate, all of the membrane leads will be on the one side of the medial axis and the membrane leads will be on the other side of the same axis.

Figure 1:
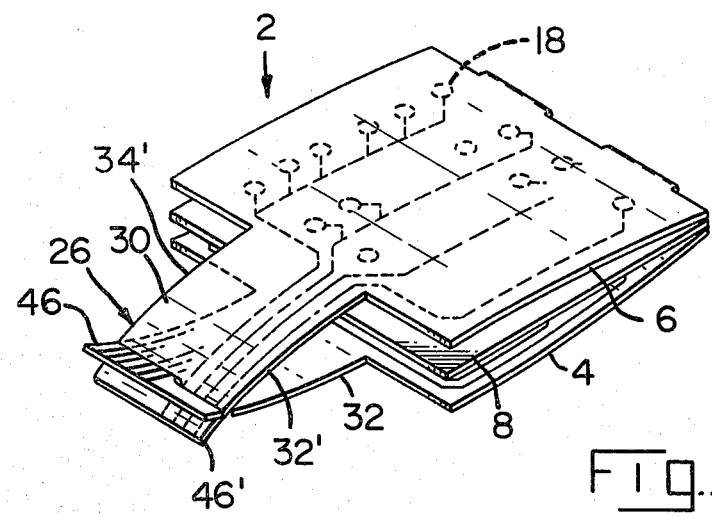
FIG. 1 is a perspective view of a membrane switch assembly in accordance with the invention.

The substrate tail section 28 is provided with a slot 42 that extends inwardly from the side edge 32 substantially to the axis 40 and which is spaced from the free end 36. The membrane tail section is provided with a slot 42' which extends inwardly from the side edge 34'. During folding, the end portions 46, 46' of the two tail sections are interlocked as indicated in FIG. 1 by means of the slots 42, 42' and in the finished assembly, the contact portions 39 of the substrate leads 38 will face upwardly as viewed in FIG. 1 while the contact portions 39' of the membrane tail section 30 will face downwardly. It should be mentioned that the assembly is shown in an uncompressed and slightly expanded condition in FIG. 1 in order to reveal the relationship of the parts. In actual use, the membrane would be entirely against the separator and the entire assembly may be contained in a suitable housing or frame. The two tail sections would also be against each other.

Figure 4:
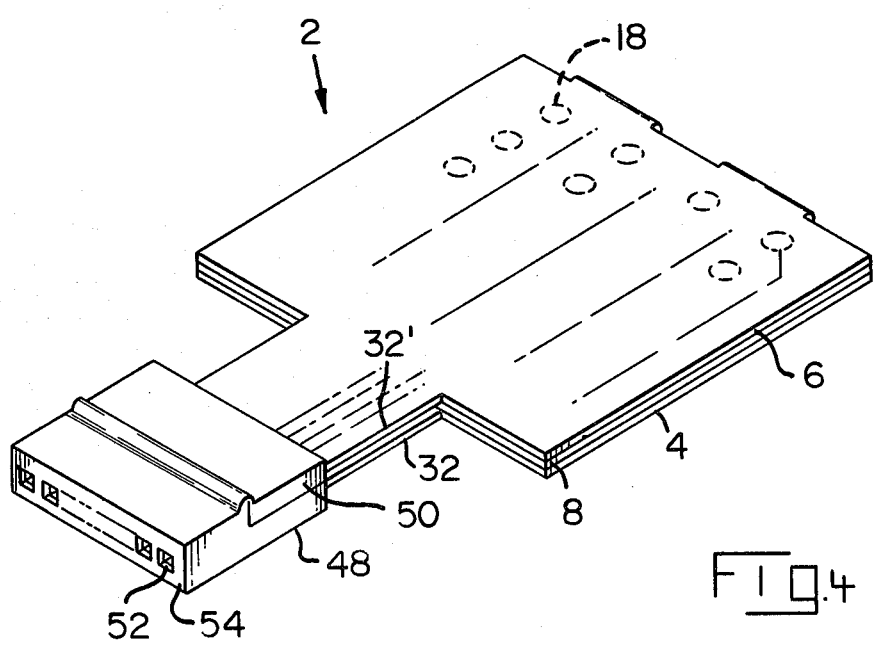
FIG. 4 is a view showing the switch assembly of FIG. 1 with an electrical connector installed on the end of the tail.

The contact portions 39, 39' of the membrane and substrate leads can be connected to external conductors by inserting the end 44 of the composite tail 26 into a multi-contact electrical connector of the type, for example, shown in U.S. Pat. No. 4,367,006. Connectors of the type shown in that patent have terminals which will establish contact with both the upper surface and the lower surface of an inserted membrane switch tail and it does not therefore matter that the contact portions 39, 39' face in opposite directions. FIG. 4 shows the switch assembly 2 with multi-contact electrical connector 48 installed on the end portion of the composite tail 26. The connector 48 comprises a housing having a hinged upper wall indicated at 50 so that the tail can be placed in the housing prior to closure of the hinged section 50. The housing contains terminals which establish contact with the contact portions of the conductors as explained in U.S. Pat. No. 4,082,402. The housing has a mating face 54 and has opening 52 therein which receive contact pins that are mated with the terminals as also explained in the above-identified U.S. Pat. No. 4,082,402. It will be understood that it is not essential to the practice of the invention that the substrate and the membrane be formed from a single sheet of film which is folded as shown at FIG. 1 although this is a preferred manufacturing method. It will also be understood that the spacer 8 can be replaced by other spacing devices such as a screened-on layer provided on one or both of the surfaces 12, 14.

Figure 5:
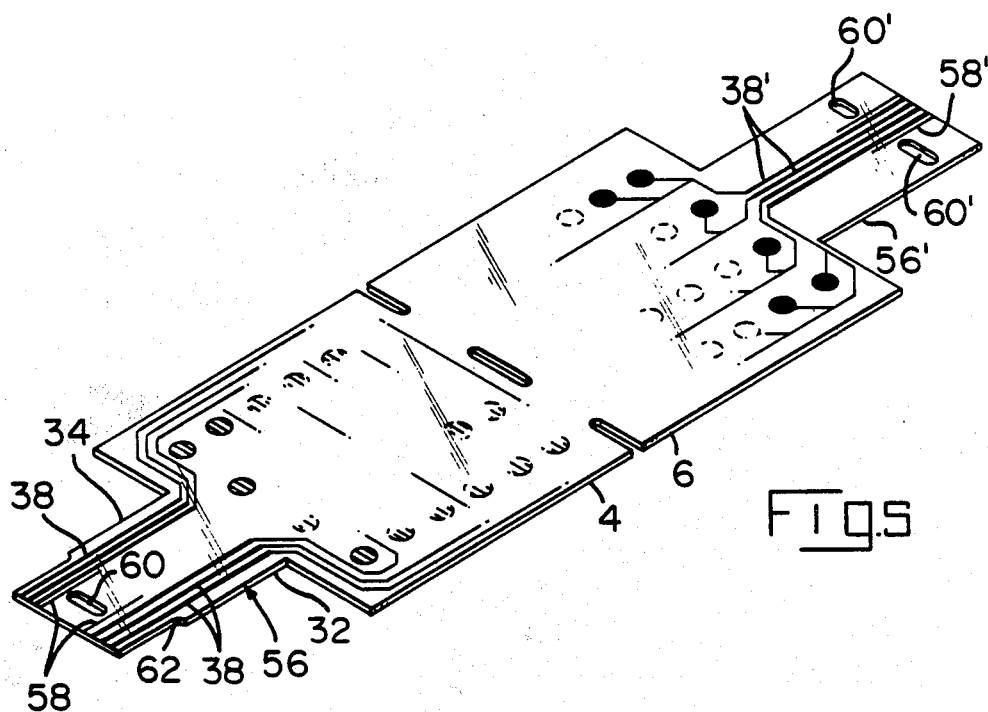
FIG. 5 is a perspective view of the substrate and membrane of an alternative embodiment of the invention.

FIG. 5 shows an alternative embodiment having a substrate 4 and a membrane 6 which is substantially similar to the corresponding substrate and membrane described above. The same reference numerals are therefore applied to the substrate and the spacer as are identified above in describing the embodiment of FIG. 1.

Figure 6:
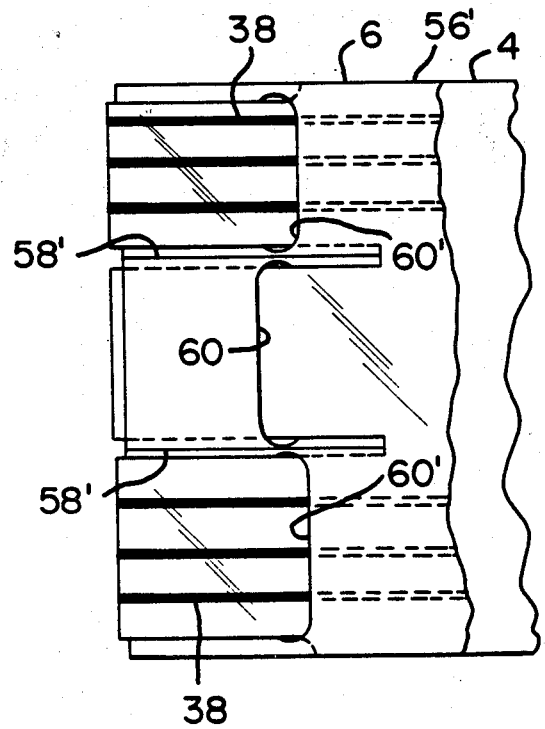
FIG. 6 is a plan view of the end section of the composite tail of a switch assembly produced by folding of the substrate and membrane of FIG. 5.

The substrate tail 56 of the embodiment of FIG. 5 has substrate leads 38 thereon which are not concentrated on one side of a medial axis but are rather located in the most convenient manner to the circuit designer. Thus the tail 56 has a group of substrate leads 38 adjacent to the edge 32 and a similar group adjacent to the edge 34. The tail is slit adjacent to its free end as shown at 58 on each side of a central slot 60 which separates the two groups of lead portions of conductors. The membrane tail 56' has all of the membrane leads 38' concentrated in a central section of the membrane tail and the membrane tail is slit as shown at 58' on each side of the group of membrane leads. The two slits 58' will thus form a flap across which the end portions of the membrane leads extend. Slots 60' are provided outwardly of the slits 58'. As shown in FIG. 6, upon folding of the membrane 6 against the substrate 4, the flap formed by the slits 58' can be inserted through the slot 60 which the flaps formed by the slits 58 can be inserted through the slots 60'. If desired, shoulders can be formed as indicated at 62 to facilitate fitting of the flaps at the ends of the tail sections through the slots. As with the previous embodiment, the contact portions of the membrane and substrate leads face in opposite directions.

It will be apparent from the foregoing that the principles of the invention several advantages; the task of the circuit designer is simplified in that he can provide circuit conductors on both surfaces 12, 14 and locate the leads from the circuit conductors on the surfaces of both of the tail sections 28, 30. This advantage can result in simplification of the circuit lines with a resulting shortening of the circuit conductors 22, 24.

I claim:
1. A membrane switch assembly of the type comprising a substrate, a membrane which is of a flexible insulating material, and a spacer between the membrane and the substrate, the substrate and the membrane having opposed switch electrodes thereon at switch sites, the spacer having openings therein at the switch sites, circuit conductors extending between and among the switch sites, and a tail extending from the assembly, the circuit conductors having leads which extend into the tail, the membrane switch assembly being characterized in that:

the substrate is also of a flexible insulating material, the tail comprises a substrate tail section which extends from the substrate and a membrane tail section which extends from the membrane, the tail sections being in parallel planes, being substantially co-extensive, and having opposed first and second tail surfaces which are contiguous with the opposed first and second surfaces of the substrate and the membrane respectively.

the substrate and the membrane each have circuit conductors thereon, the circuit conductors on the substrate having substrate leads which extend onto the first tail surface, the circuit conductors on the membrane having membrane leads which extend onto the second tail surface, the substrate leads extending parallel to the membrane leads and being offset with respect to the membrane leads, the substrate tail section and the membrane tail section each having a free end and side edges extending to the free end, each tail section having an end portion which extends from a location adjacent to its free end to its free end, the substrate leads and the membrane leads extending to the free end of the substrate tail section and the membrane tail section respectively and having contact portions extending across the end portions of the substrate tail section and the membrane tail section, the contact portions being exposed with the contact portions of the substrate leads facing oppositely with respect to the contact portions of the membrane leads, and the membrane tail section and the substrate tail section each have at least one slot extending transversely of the side edges of the tail sections, the slots being spaced from the free ends of the tail sections, a part of the end portion of the substrate tail section extending through the slot in the membrane tail section, a part of the end portion of the membrane tail section extending through the slot in the substrate tail section, the parts of the end portions which extend through the slots having the contact portions of conductors thereon.

2. A membrane switch assembly as set forth in claim 1 characterized in that the substrate leads are grouped on one side of a medial axis which extends from the free end of the tail between, and parallel to, the side edges of the tail, the membrane leads being on the other side of the medial axis, the slot in the substrate tail section being on the other side of the medial axis, the slot in the membrane tail section being on the one side of the medial axis.

3. A membrane switch assembly as set forth in claim 1 characterized in that the substrate leads are on both sides of a medial axis which extends from the free end of the tail between the side edges thereof and parallel to the side edges, and the membrane leads are also on both sides of the medial axis, the slots in the substrate tail section and in the membrane tail section being in alignment with the membrane leads and the substrate leads respectively, the substrate tail section and the membrane tail section each having slits extending from their free ends inwardly through the end portions thereof, the slits dividing the end portions into flaps which are inserted through the slots.

4. A membrane switch assembly as set forth in claim 1 characterized in that the end portion of the tail has terminals thereon, the terminals being in electrical contact with the end portions of the substrate leads and the membrane leads.

5. A membrane switch assembly as set forth in claim 1 characterized in that the slot in the end portion of the substrate tail section is opposite to the end portions of the membrane leads, and the slot in the end portion of the membrane tail section is opposite to the end portions of the substrate leads.

6. A membrane switch assembly as set forth in claim 5 characterized in that the slots comprise cut out sections of the end portions of the substrate tail section and the membrane tail section.

7. A membrane switch assembly as set forth in claim 6 characterized in that the membrane tail section and the substrate tail section are interlocked along side edge portions thereof.

8. A membrane switch assembly as set forth in claim 6 characterized in that the membrane tail section and the substrate tail section are secured to each other by an adhesive.

* * * * *